United States Patent [19]

Paz

[11] 4,199,722
[45] Apr. 22, 1980

[54] TRI-STATE DELTA MODULATOR

[76] Inventor: Israel Paz, 112 Shd. Hanasy, Haifa, Israel, 34642

[21] Appl. No.: 701,449

[22] Filed: Jun. 30, 1976

[51] Int. Cl.² ......................................... H03K 13/22
[52] U.S. Cl. ....................................................... 375/27
[58] Field of Search ............ 332/11 D; 358/260, 261, 358/133, 135, 262; 325/38 B, 38 R, 38 A

[56] References Cited

U.S. PATENT DOCUMENTS

| | | | |
|---|---|---|---|
| 2,568,721 | 9/1951 | De Loraine | 325/38 B |
| 2,897,275 | 7/1959 | Bowers | 325/38 B |
| 2,905,756 | 9/1959 | Graham | 358/135 |
| 2,916,553 | 12/1959 | Crowley | 325/38 B |
| 3,273,141 | 9/1966 | Hackett | 325/38 B |
| 3,402,352 | 9/1968 | Lerner | 325/38 B |
| 3,706,944 | 12/1972 | Tewksbury | 325/38 B |
| 3,716,803 | 2/1973 | Candy | 325/38 B |
| 3,769,453 | 10/1973 | Bahl | 358/261 |
| 3,795,900 | 3/1974 | Monford | 325/38 B |
| 3,813,485 | 5/1974 | Arps | 358/261 |
| 3,937,871 | 2/1976 | Robinson | 358/261 |
| 3,973,199 | 8/1976 | Widmer | 325/38 B |
| 4,087,754 | 5/1978 | Song | 325/38 B |
| 4,101,881 | 7/1978 | De Freitas | 325/38 B |

OTHER PUBLICATIONS

"Digital Pitch Detector Using Delta Modulator and Limited-Length Bit-Pattern Generator", Frei et al., IBM Tech. Disc. Bulletin, vol. 16, #4, pp. 1650-1651, Sep. 1973.

*Primary Examiner*—Benedict V. Safourek
*Assistant Examiner*—Michael A. Masinick
*Attorney, Agent, or Firm*—Marvin J. Marnock; John R. Manning; Marvin F. Matthews

[57] ABSTRACT

A delta modulation system with an encoder for encoding successive samples of an analog signal during successive sample intervals into a digital status change code signal indicating the difference between a sample and an estimate of the sample as one of three states: increasing, decreasing or unchanged in status. The status change code signal is transmitted to a decoder which reconstructs the analog signal from the digital status change signal. The status change code signal is also used in the encoder to estimate the next sample of the analog signal.

12 Claims, 10 Drawing Figures

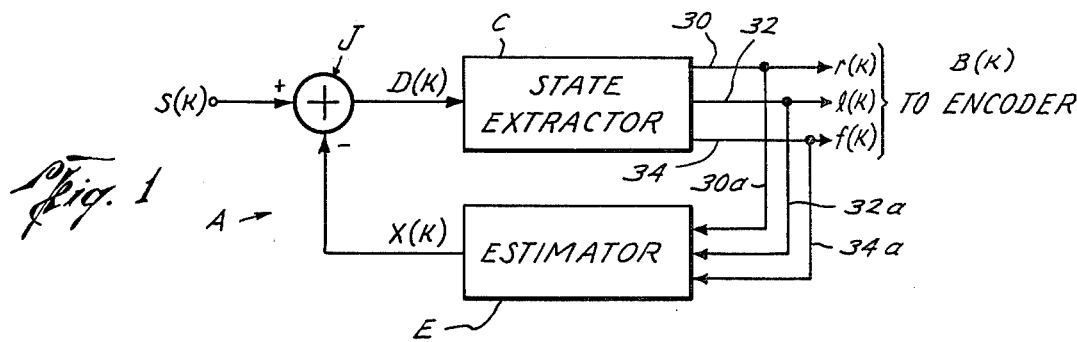
Fig. 1
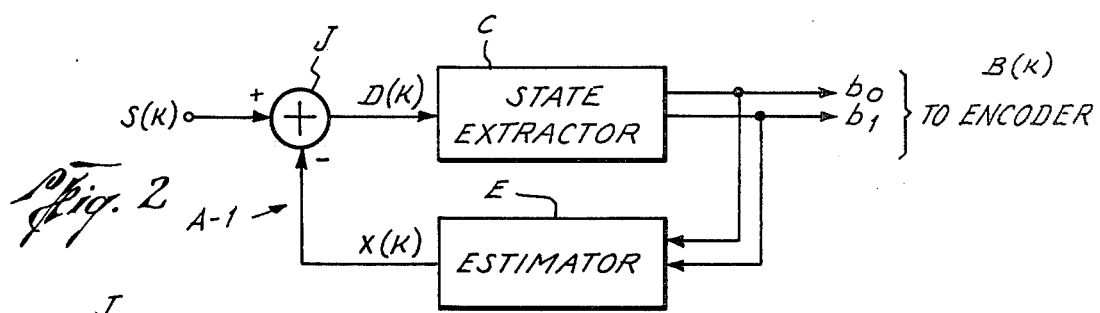
Fig. 2
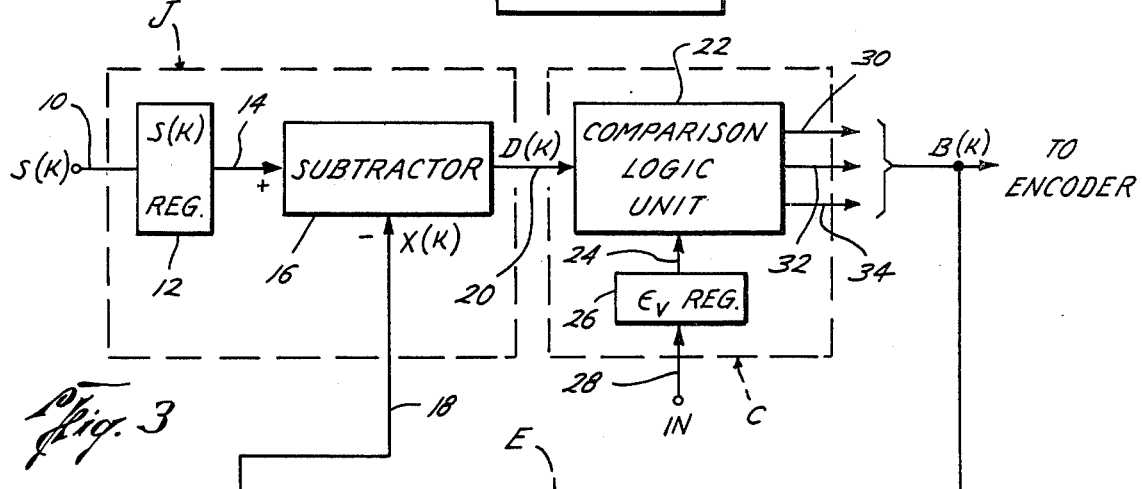
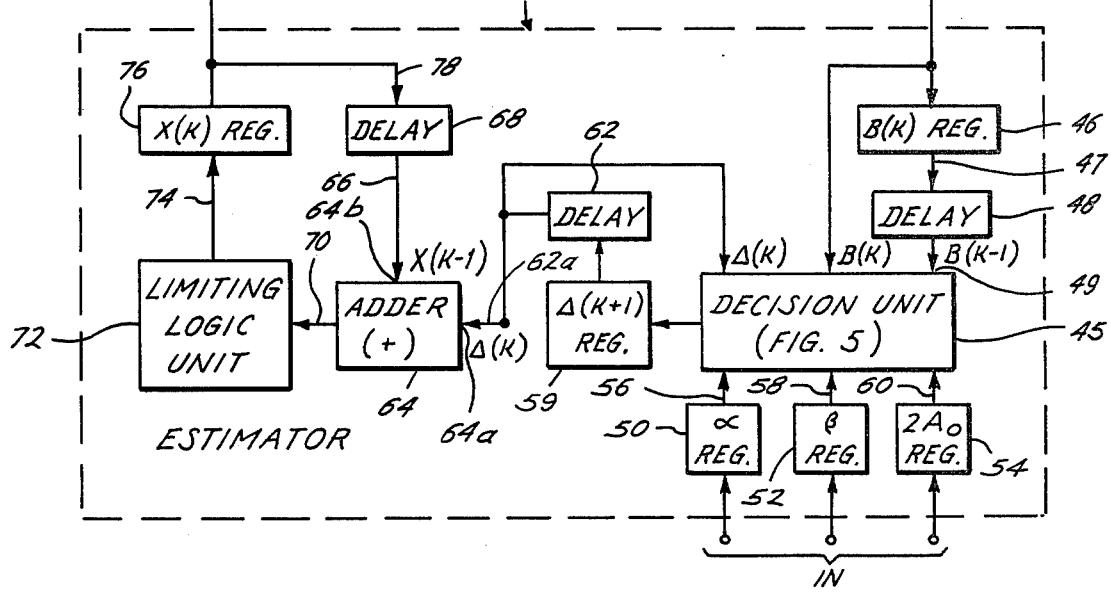
Fig. 3

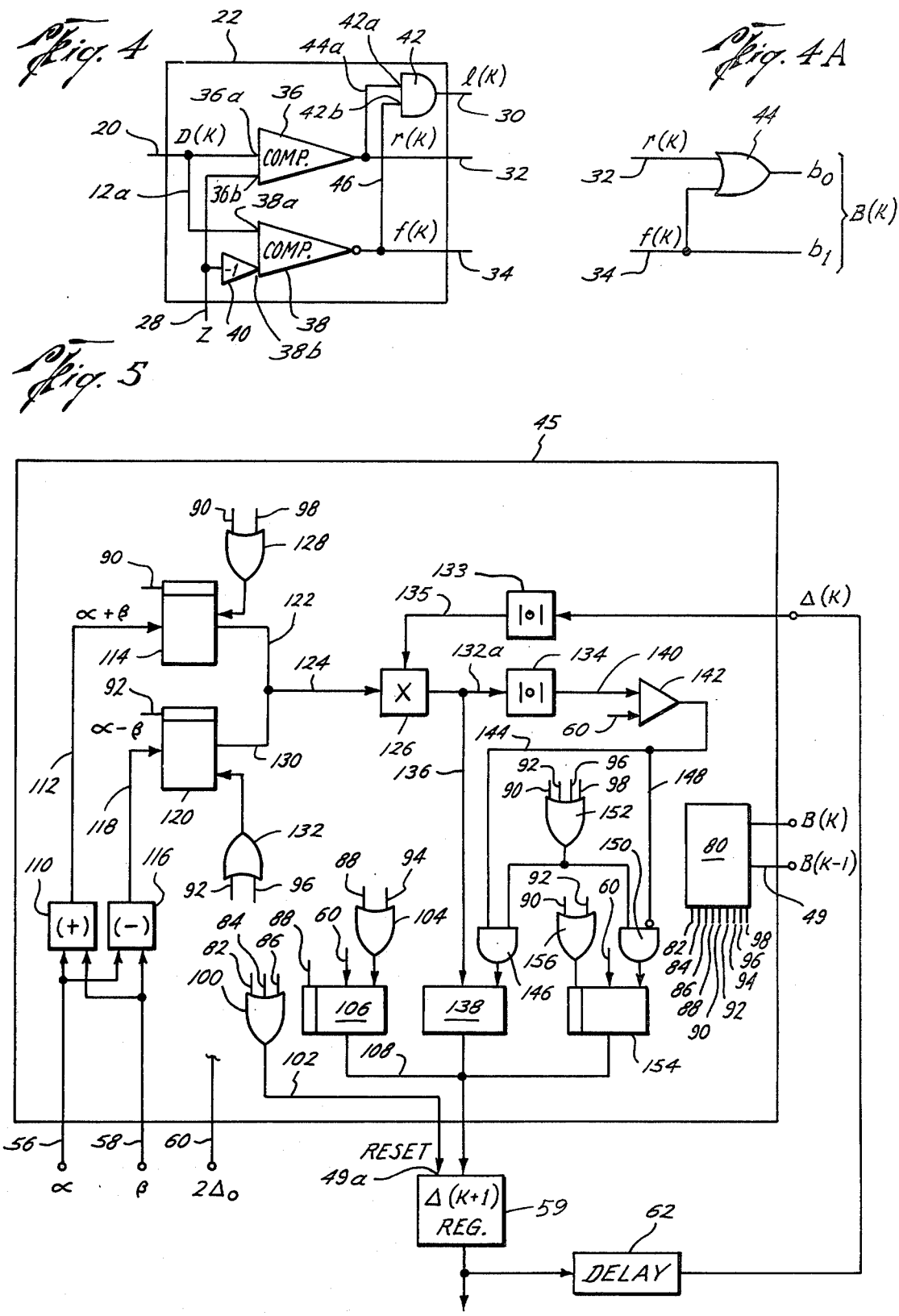

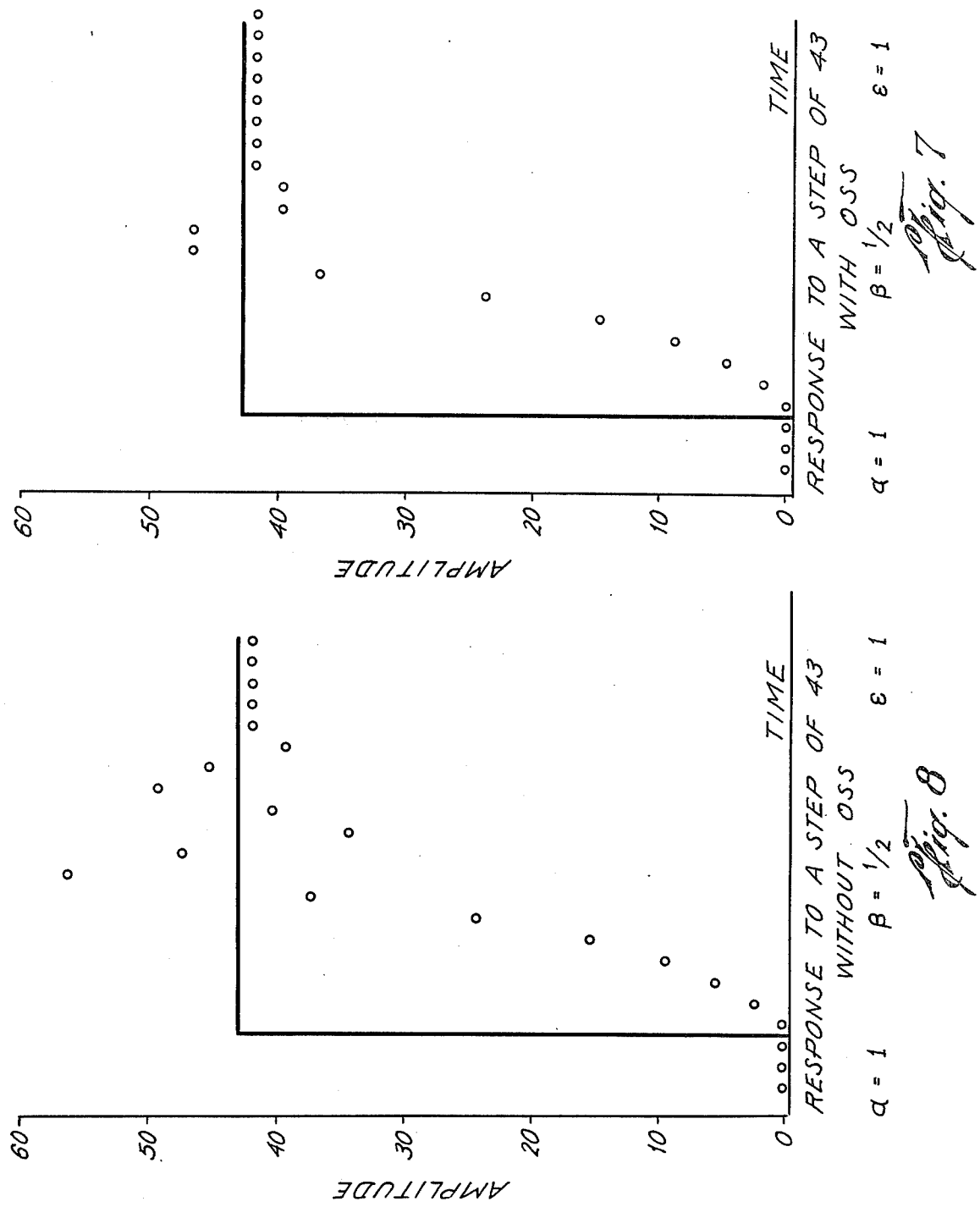

TRI-STATE DELTA MODULATOR

BACKGROUND OF THE INVENTION

1. Field of Invention

The present invention relates mainly to delta modulation communication systems. It does, however, have applications in other technical fields, e.g.: source encoding for data compacting and fingerprint extraction from pictorial or graphical data, etc.

2. Description of the Prior Art

In known delta modulation methods, an encoder forms a pulse if the signal being encoded is greater than an estimate of the signal value, and no pulse if the signal being encoded is less than the estimate.

Considerable effort has been expended in delta modulation systems for both video and voice communications. Some of this effort has been directed to reducing the number of bits or pulses required to describe the analog signal, as exemplified by U.S. Pat. Nos. 3,593,141; 3,824,590; and 3,339,142. Other systems, as exemplified by U.S. Pat. No. 3,643,180, have attempted to provide a higher signal-to-noise ratio.

Other efforts have been directed to adaptive-to-linear delta modulated signal converters, as exemplified by U.S. Pat. No. 3,703,688; conference circuits for delta modulated digital telecommunications systems, as exemplified by U.S. Pat. No. 3,842,351; and statistical delta modulation systems as exemplified by U.S. Pat. No. 3,393,364.

Adaptive delta modulators, as exemplified by U.S. Pat. Nos. 3,824,590; 3,652,957; and 3,339,142; have attempted to generate estimates approximating abrupt large amplitude voltage changes in the input signals. An alternative to adaptive delta modulations in approximating a signal with sharp rise times is disclosed in U.S. Pat. No. 3,723,909.

Hence, prior art efforts were directed to improving the operation of delta modulators in generating estimates to accurately follow abrupt voltage discontinuities in the input signal. However, when the input signal did not substantially change, such as during intervals of substantially constant levels of a video input signal, adaptive delta modulation systems had the undesirable effect on video signals of creating high granularity in the reconstructed video signal. This occurred because minor signal level fluctuations were estimated to be the beginning of an abrupt change, causing pulses to be formed when no significant change was present, and because, inherently, the conventional delta modulators, being differential devices, have to send error pulses even when no change in the signal is detected.

So far as is known, systems which adaptively and accurately followed abrupt changes in the input signal being encoded have been generally undesirable for tracking substantially constant video signal levels due to granularity in the reconstructed signal. Conversly, systems with low granularity in the reconstructed signal have been inaccurate and slow in responding to abrupt changes in the input signal. To overcome such undesirable effects, "adaptive" delta modulation systems have been proposed that try to reconciliate between the above conflicting features. They do so by changing the size (in the Estimator) of the increment (step size) in accordance with some nonlinear function of the past history of the differences in value between the signal and its estimate.

However, so far as is known, none of these systems can reduce granularity to zero. This is due, as already mentioned, to their intrinsic differential structure that requires the transmission of error signals even when the signal to be tracked is constant over long periods of time.

Moreover, in addition to such deficiencies, the non-linearities introduced into these systems lead to unwanted large overshoots in the estimates of the signals they try to acquire and track. Such overshoots when introduced into estimates of signals bearing pictorial information will ultimately produce "multiple-edge" disturbances in the reproduced pictures.

Overshoot-suppression algorithms and the circuits developed to implement them seem to be not very effective in overcoming such deficiencies when introduced into conventional delta modulator systems. The modulation technique developed for the present invention, however, proved to be a significant improvement over this deficiency. This improved behavior is due to the fact that in the new (three-state) device the signal estimate, when recovering from an overshoot, has three rather than two states into which it can settle.

SUMMARY OF THE INVENTION

Briefly, the present invention provides a new and improved delta modulation system for encoding successive samples of an analog signal taken during successive sample intervals into an output digital signal which indicates the difference between the samples and internally generated estimates of the samples as being in one of three difference states: increasing, decreasing or unchanged. The system also includes a decoding apparatus which reconstructs the analog signal from the digital signal. The output digital signal indicating the three different states may be a parallel digital word of three bits, or a serial digital word of two bits.

With the use of a digital signal indicating three states according to the present invention, granularity occurring in the reconstructed signal is substantially eliminated, while permitting abrupt signal changes or discontinuities to be readily detected and tracked. This can be done here faster and easier than in conventional systems, because the present invention accommodates easier, more efficient overshoot suppression schemes.

The encoding apparatus includes a difference signal determining circuit which forms a difference signal representing the difference between a sample of the analog signal and its estimate, and a signal generator which forms the digital output signal representing an increasing, decreasing or unchanged state of difference in the difference signal. The increasing, decreasing and unchanged status conditions of the digital signal are typically formed in response to the present sample being greater than, less than and essentially or substantially equal to the estimate, respectively. The digital status signal formed in the encoder for each input analog signal sample is also used in the estimator circuit of the encoder to generate the estimate of the next analog sample.

The signal generator further includes a comparison circuit to compare the difference signal to a specified threshold value and generate the output digital signal which represents a digital status change code for each sample of the analog signal. This output digital signal is thereafter transmitted by conventional communications techniques over a communications path to a receiver having therein a decoder according to the present invention. One of the main advantages of the present invention is its immediate adaptability to Run-Length and other data compaction codes. The device can produce (on three different output lines, if necessary) three different types of output digital signal strings (chains). These signal strings are used to inform the Estimator (and therefore also the receiver) not only about the direction in which the estimate should change, in order to follow the signal, but also about the length of time (number of consecutive samples) during which it should do so. The output signals are therefore ideally suited here for Run-Length or other data compaction coding schemes because for each signal string only one symbol indicating its type and another one indicating its length need be transmitted.

BRIEF DESCRIPTION OF THE DRAWINGS

FIG. 1 is a functional block diagram of the encoding apparatus of the present invention;

FIG. 2 is a functional block diagram of an alternative encoding apparatus of the present invention;

FIG. 3 is a schematic electrical circuit diagram of the encoding apparatus of FIGS. 1 and 2;

FIG. 4 is a schematic electrical circuit diagram of the comparison logic unit of FIG. 3;

FIG. 4A is a schematic electrical circuit diagram of circuitry added to the circuit of FIG. 4 for use as a comparison logic unit in the apparatus of FIG. 2 as an example way to translate three-bits-per word output of FIG. 4 into two bits per word output;

FIG. 5 is a schematic electrical circuit diagram of the estimator decision unit of FIG. 3;

FIGS. 7 and 8 are waveform diagrams of sample estimates, obtained by computer simulations, in response to a step function with and without overshoot suppression, respectively.

DESCRIPTION OF THE PREFERRED EMBODIMENT

Figure 3A:
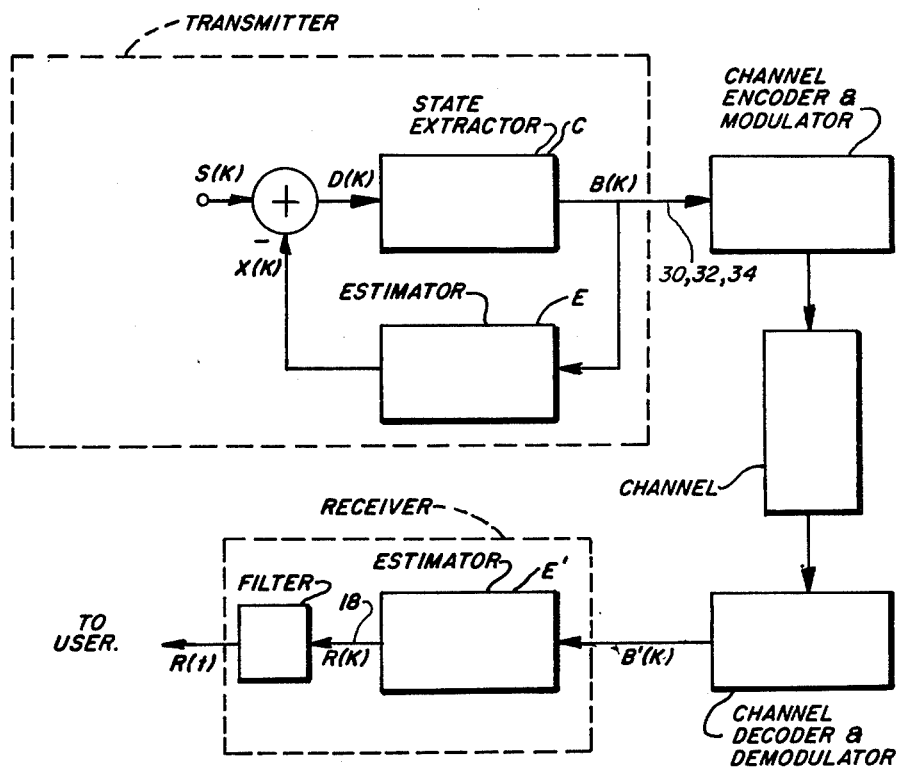
FIG. 3A is a block diagram of a communication system embodying the present invention.

In the drawings, the letter A (FIG. 1) designates generally the encoding apparatus of the present invention, for encoding successive samples S(k) of an analog input signal S(t) during successive sample time intervals k into a digital output signal B(k) which indicates the difference between a particular sample and an internally generated or formed estimate of the sample as one of three states: increasing, decreasing or unchanged. The encoder apparatus A forms an output signal in the format of three digital bits: r(k), indicating presence or absence of an increasing or rising state; l(k), indicating presence or absence of an unchanged or essentially or substantially level state; and f(k), indicating presence or absence of a decreasing or falling state. In an alternative apparatus A-1 (FIG. 2), information represented by the three parallel data bits r(k), l(k), and f(k) are encoded into an output signal B(k) in the format of two serial bits, $b_0$ and $b_1$.

After transmission of the output signal B(k), in either format, by conventional digital signal communication techniques over a communications path, and receipt thereof, the signals are decoded in a manner to be set forth to determine whether a reconstructed analog signal sample R(k) in the decoder representing the reconstructed analog input signal R(t) during the sample interval k, should be increased, decreased or unchanged.

In the encoding apparatus A (FIG. 1), a subtractor J receives the sample S(k) from a conventional analog sampling circuit over a conductor 10 (FIG. 3) during the sample interval k in an analog sample storage register 12. The storage register 12 provides the analog signal samples stored therein over a conductor 14 to a positive input terminal of an analog subtracting circuit 16. An estimate X(k) of the sample S(k) formed in an estimator circuit E is provided to a negative input terminal of the subtractor 16 over a conductor 18. The subtractor 16 produces a difference signal D(k), which may be positive, zero or negative depending on the relative magnitude of the input signals X(k) and S(k).

The difference signal D(k) is provided over a conductor 20 to a comparison logic unit 22 (FIGS. 3 and 4) of a status change extractor circuit C. The comparison logic 22 further receives over input conductor 24 a threshold signal Z from an analog storage register 26. The signal Z represents a threshold constant $\epsilon_\nu$, defined in a manner set forth below, which is received as an input signal over a conductor 28. The logic unit 22 forms the output signal B(k) from the signals Z and D(k) in the form of three parallel bits l(k), r(k) and f(k) over output conductors 30, 32 and 34, respectively. The three parallel bits r(k), l(k) and f(k) thus indicate an unchanged or level state, an increasing or rising state, and a decreasing or falling state depending upon whether the difference signal D(k) is within the threshold constant $\epsilon_\nu$ of zero, more positive than such threshold or more negative than such threshold.

The three bits of the signal B(k) are also provided over conductors 30a, 32a and 34a to the estimator circuit E (FIG. 1) which forms an estimate X(k+1) for the next or (k+1) sample of the analog signal S(t), in a manner to be set forth below. The comparison logic unit 22 (FIG. 4) includes a rise or increasing status comparator 36 and a fall or decreasing status comparator 38 which are conventional comparator amplifiers. The difference signal D(k) from the subtractor J is provided over the conductor 20 to an input terminal 36a of the comparator 36 and over a conductor 12a to an input terminal 38a of the comparator 38. The threshold signal Z is provided over the conductor 28 to an input terminal 36b of the comparator 36 and to an inverter 40 connected to an input terminal 38b of the comparator 38.

The rise comparator 36 forms an output signal having a voltage level corresponding to a digital "1" bit on the conductor 32 as the rise signal r(k) when the difference signal D(k) has a positive value greater than the positive value of the threshold signal Z. Conversely, the rise comparator 36 forms an output signal having a voltage corresponding to a digital "0" bit as the rise signal r(k) when the difference signal D(k) has a value less than the threshold signal Z. Thus, when the comparator 36 forms a digital "1" output signal, the sample S(k) is greater than the estimate X(k) by an amount greater than the threshold signal Z. Similarly, when the sample S(k) does not exceed the estimate X(k) by an amount greater than the threshold signal Z, the comparator 36 forms an output digital "0" as the signal r(k).

The fall or decreasing binary signal bit f(k) is formed in the decreasing comparator 38, which provides an output voltage level corresponding to a digital "1" on the conductor 34 when the difference signal D(k) is more negative than the negative threshold signal Z provided through the inverter or sign changer 40. When the negative threshold signal Z is more negative than the signal at the input terminal 38a, the comparator 38 forms an output signal on conductor 34 corresponding in voltage level to a digital "0".

The comparator 38 accordingly forms a digital "1" for the falling signal f(k) when the estimate X(k) is greater than the sample S(k) by an amount greater than the threshold signal Z. Further, since comparators 36 and 38 receive the difference signal D(k) as a common input and compare the difference signal with threshold signal values of opposite polarity or sign, only one of the signals r(k) or f(k) can be digital "1" at one time. However, both signals r(k) and f(k) may be digital "0" at the same time, when the difference signal D(k) is less than either the positive or negative value of the threshold signal Z.

A "NAND" gate 42 receives the digital signals r(k) and f(k) from the comparators 36 and 38 over input conductors 44a and 46 at input terminals 42a and 42b, respectively. The gate 42 forms the level or unchanged digital signal l(k) as a digital "0" and provides such signal over the conductor 30 in response to the presence of a digital "1" in either the rising signal r(k) or the falling signal f(k) at the input terminals 42a or 42b, respectively. When both the rising signal r(k) and the falling signal f(k) are digital "0", the gate 42 forms a digital "1" as the level signal l(k), indicating the difference signal D(k) as less than either the positive or negative values of the threshold signal Z. The three parallel bits l(k), r(k) and f(k) of the signal B(k) are provided as outputs over conductors 30, 32 and 34 to an encoder or modulator for transmission as has been set forth.

FORMATION OF TWO BIT/WORD DIGITAL SIGNAL B(k)

As has been set forth, in the apparatus A-1, the three parallel bit binary word B(k) is converted to a two bit data word B(k) including a first, least significant bit $b_0$ and a second, most significant one $b_1$. In the apparatus A-1 (FIGS. 2 and 4A) the estimator E and state extractor C are of like structure and function with the apparatus A (FIG. 1) except for an output "OR" gate 44 (FIG. 4A) connected to the output conductors 32 and 34 in place of the NAND gate 42 (FIG. 4). The gate 44 converts the parallel three bit word B(k) to a two bit data word B(k) including the bit $b_0$ which indicates with a digital "1" whether either the signal r(k) or the signal f(k) is digital "1" during the sample interval k. Conversely, when neither of the signals r(k) or f(k) is digital "1", the bit $b_0$ is digital "0", conveying the same information as a digital "1" value for the level signal l(k), making transmission of the level signal l(k) unnecessary. When the first bit $b_0$ is digital "1", the second bit $b_1$ indicates with a digital "1" that the signal f(k) is a digital "1", and with a digital "0" that the signal r(k) is a digital "1".

The bit $b_0$ formed in the gate 44 and the bit $b_1$ are then read in parallel format into a conventional shift register. They may be read out therefrom if so required in serial format to form the change signal B(k) to serial data bits.

The three bits per word parallel output format of the three state delta modulator of the present invention and the corresponding formats used here for the equivalent two bits per word symbols are set forth in Table I below.

TABLE I

| | Alternative Representations of the Status Change Conditions | | | | |
|---|---|---|---|---|---|
| | B(k) PARALLEL WORD FORMAT | | | B(k) SERIAL WORD FORMAT | |
| STATUS CODE | l(k) | f(k) | r(k) | $b_1$ | $b_0$ |
| UNCHANGED | 1 | 0 | 0 | 0 | 0 |
| DECREASING | 0 | 1 | 0 | 1 | 1 |
| INCREASING | 0 | 0 | 1 | 0 | 1 |

The signal B(k) in either of the formats set forth above is then modulated onto a carrier and transmitted over a communications path, as has been set forth and is also provided to the estimator E (FIG. 3) for use in forming a revised estimate signal X(k+1) for comparison during the sample interval k+1 with the next sample S(k+1).

In the estimator E (FIG. 3), the digital signal B(k) from the comparison logic unit 22 is received at a decision unit 45 and is also received and stored in a status change register 46. When the signal B(k) is in parallel format, the register 46 is a conventional three-bit parallel storage register. When the signal B(k) is in serial format, the register 46 is a conventional two-bit serial storage register with parallel data read-out. The stored signal B(k) in register 46 is provided over a conductor 47 through a time delay circuit 48, having a time delay equal to the sample interval, and therefrom over a conductor 49 to the decision unit 45. The signal present on conductor 49 during time interval k after delay in time delay 48 thus represents the signal B(k) during the previous sample interval B(k−1).

The decision unit 45 forms, in a manner to be set forth, an increment signal Δ(k+1) during interval k, which increment signal represents the estimated adjustment increment to be made to the estimate signal X(k+1) for the next sample interval k+1. The increment signal Δ(k+1) is stored in an increment register 59.

Constants $\alpha,\beta$ and $2\Delta_0$ from registers 50, 52 and 54, respectively, are provided over conductors 56, 58 and 60 to the decision unit 45 for use in forming the increment signal Δ(k+1). These constants may be externally supplied constants at one of several values, whose values may be set to increase the encoding versatility of the apparatus A for use with various types of analog signals or they may be fixed, predetermined variables based on a particular type of analog signal to be encoded.

The decision unit 45 further receives from a one sample interval time delay circuit 62 the increment signal Δ(k+1), which after one sample interval time delay represents the signal value Δ(k).

The increment Δ(k+1) in the increment register 59 is also provided after delay over a conductor 62a to an input terminal 64a of an adder 64 as the signal value Δ(k). The adder 64 further receives the estimate signal X(k−1) formed during the previous or (k−1) cycle at an input terminal 64b. The estimate signal X(k−1) is provided to the adder 64 over a conductor 66 from a one sample interval delay circuit 68. The adder 64 adds the increment signal Δ(k) and the estimate signal X(k−1) provided thereto and forms an estimate X(k) from the resulting sum, which is provided over a conductor 70 to a limiting logic unit 72.

The logic unit 72 stores therein maximum and minimum predetermined values for the estimate X(k), based on the type of signal being encoded, and limits the value of the estimate X(k) to a value within assigned bounds. The newly formed estimate X(k) from the limiting unit 72 is provided over a conductor 74 to an estimate register 76 where it is stored before being furnished over the conductor 18 to the subtractor J (FIG. 3). The newly formed estimate X(k) is also provided over a conductor 78 to the delay circuit 68 where it is delayed one sample interval before being furnished to the adder 64, as has been set forth above.

The decision unit 45 forms the increment signal $\Delta(k+1)$ which after being delayed to $\Delta(k)$ is added to the previous estimate $X(k-1)$ in the adder 64 to form the present estimate X(k). In the decision unit 45 (FIG. 5), a logic decoder 80 receives the signal B(k) from the comparison logic unit 22 and the signal $B(k-1)$ on the conductor 49, and forms therefrom a set of nine control signals: Y(1) through Y(9). Table II lists the control signals Y(1) through Y(9) and the state of the two input signals B(k) and $B(k-1)$ in response to which such signals are a digital "1", together with an output conductor, 82 through 98, from the decoder 80 on which each such control signal is present.

TABLE II

| Conductor | B(k) | B(k-1) | Digital Logic Definition |
|---|---|---|---|
| Y(1) 82 | Level | Level | $l(k) \cdot l(k-1)$ |
| Y(2) 84 | Level | Fall | $l(k) \cdot f(k-1)$ |
| Y(3) 86 | Level | Rise | $l(k) \cdot r(k-1)$ |
| Y(4) 88 | Fall | Level | $f(k) \cdot (k-1)$ |
| Y(5) 90 | Fall | Fall | $f(k) \cdot f(k-1)$ |
| Y(6) 92 | Fall | Rise | $f(k) \cdot r(k-1)$ |
| Y(7) 94 | Rise | Level | $r(k) \cdot l(k-1)$ |
| Y(8) 96 | Rise | Fall | $r(k) \cdot f(k-1)$ |
| Y(9) 98 | Rise | Rise | $r(k) \cdot r(k-1)$ |

The logic components in the logic decoder 80 are conventional digital logic gates which form the output signals according to Table II above. For example, nine conventional AND gates could be used as the components of the logic decoder 80, receiving inputs according to the logic equations above and forming the particular output signal Y, as indicated above.

The control signals Y are provided over their respective electrical conductors to various other components of the decision unit 45 to be set forth below. Due to the numerous electrical connections with the output conductors of the decoder 80, these electrical conductors are not shown in detail in FIG. 5 in order to preserve clarity in the drawing. Rather, the conductors providing a particular control signal Y from the decoder 80 as inputs to other components of the decision unit 45 have assigned thereto the reference numeral corresponding to the output conductor from the logic decoder 80 for such control signal Y.

For example, the control signals Y(1), Y(2) and Y(3) are provided over conductor links 82, 84 and 86, respectively, to an "OR" gate 100, as indicated at the input conductors thereto. The "OR" gate 100 transmits a digital "1" over conductor 102 to a reset terminal 49a of the $\Delta(k+1)$ register 49 in response to a digital "1" applied to at least one of its inputs, causing the register 49 to reset the value of $\Delta(k+1)$ to zero. Hence, when the present output signal B(k) is level or unchanged, the decision unit 45 resets the $\Delta(k+1)$ register 59 to "0".

Control signals Y(4) and Y(7), indicating a change in state preceded by a level state in the signal B(k) are provided over conductors 88 and 94 to an "OR" gate 104, which forms a digital "1" in response to a digital "1" at either input, and provides such signal to a register 106. The register 106 responds to the digital "1" input from the gate 104 and transmits a data value stored therein to the register 59 over the conductor 108. The data value stored in the register 106 has a magnitude of $2\Delta_0$ which is provided to the register 106 over the conductor 60, while the sign of such $\Delta$ value is controlled by the presence or absence of a digital "1" on the conductor 88. The presence of a digital "1" at the sign control input of the register 106 indicates a fall state preceded by a level state (Table II) and causes a negative data value, $-2\Delta_0$, to be sent to the register 59. Conversely, the presence of a digital "0" at the sign control terminal of the register 106 indicates a rise state preceded by a level state (Table II) and causes a positive data value, $2\Delta_0$, to be sent to the register 59.

The constants $\alpha$ and $\beta$ provided to the decision unit 45 over conductors 56 and 58, respectively, are summed in an adder 110 and the output sum of adder 110 is furnished over a conductor 112 to a storage register 114. The constant $\beta$ is subtracted from the constant $\alpha$ in a subtractor 116, and the output difference therefrom is furnished over conductor 118 to a storage register 120.

The storage register 114 furnishes the sum $(\alpha+\beta)$ stored therein over a conductor 122 and a conductor 124 to a multiplier circuit 126 when energized by a control "OR" gate 128. The gate 128 receives control signals Y(5) and Y(9) over input conductors 90 and 98, respectively and in response to either control signal being a digital "1" energizes the register 114 to furnish the contents thereof to the multiplier 126. The polarity or sign of the contents of the register 114 furnished to the multiplier 126 is controlled by a sign control terminal of the register 114 connected to control signal Y(5) on conductor 90. If the control signal Y(5) is a digital "1", the contents of register 114 are provided with a negative sign to the multiplier 126. Conversely, when the control signal Y(5) is a digital "0", the contents of register 114 are furnished with a positive sign to the multiplier 126.

The storage register 120 furnishes the difference $(\alpha-\beta)$ stored therein over a conductor 130 and the conductor 124 to the multiplier 126 when energized by a control "OR" gate 132. The gate 132 receives control signals Y(6) and Y(8) over input conductors 92 and 96 and in response to either control signal being a digital "1" energizes the register 120 to furnish the contents thereof to the multiplier 126. The polarity or sign of the contents of register 120 furnish the multiplier 126 is controlled by a sign control terminal of the register 120 connected to control signal Y(6) on conductor 92. If the control signal Y(6) is a digital "1", the contents $(\alpha-\beta)$ of register 120 are provided with a negative sign, $-(\alpha-\beta)$. Conversely, when the control signal Y(6) is a digital "0", the contents of register 120 are furnished with a positive sign, or $(\alpha-\beta)$.

An absolute value circuit 133 receives the increment signal $\Delta(k)$ from the delay circuit 62 and furnishes such signal over a conductor 135 to the multiplier circuit 126. The multiplier circuit 126 forms a product of the absolute value of the increment signal $\Delta(k)$ and the contents of the register 114 or 120, as the case may be, provided thereto over the conductor 124 and furnishes such product signal over a conductor 132a to an absolute value determination circuit 134 and over a conductor 136 to a storage register 138.

The absolute value circuit 134 forms an absolute value of the product signal formed in the multiplier 126 and furnishes such absolute value over a conductor 140 to a comparator 142. The comparator 142 compares the magnitude of the absolute value function provided thereto over the conductor 140 with the input constant $2\Delta_0$ provided thereto over the conductor 60 and forms an output signal having a voltage level corresponding to a digital "1" when the magnitude of the product function provided thereto over the conductor 140 is greater than the constant $2\Delta_0$. Conversely, when the constant $2\Delta_0$ exceeds the magnitude of the product function provided to the comparator 142, an output signal having a voltage level corresponding to a digital "0" is formed.

The output signal from the comparator 142 is provided over a conductor 144 to an AND gate 146 and over a conductor 148 to an inverting input terminal of an AND gate 150.

The AND gate 146 and the AND gate 150 further receive at input terminals thereof the output of an OR gate 152, which receives as input signals the control signal Y(5) on the conductor 90, the control signal Y(6) on the conductor 92, the control signal Y(8) on the conductor 96 and the control signal Y(9) on the conductor 98.

The AND gate 146 controls operation of the increment storage register 138, while the AND gate 150 controls operation of a $2\Delta_0$ constant storage register 154. The register 154 stores therein the magnitude of the input constant $2\Delta_0$ provided thereto over the conductor 60. The sign of the constant stored in the register 154 is controlled by an OR gate 156 receiving the control signals Y(5) and Y(6) over input conductors 90 and 92.

The OR gate 152 is energized in response to receipt of any one of the control signals Y(5), Y(6), Y(8) and Y(9), indicating respectively two successive fall states in the signal B(k), a fall state preceded by a rise state, a rise state preceded by a fall state and a rise state preceded by a rise state (Table II), each of which represents an abrupt signal change or discontinuity in input signal levels.

The comparator 142 compares the constant $2\Delta_0$ with the magnitude of the product function formed in the multiplier 126 to determine which of such input signals is largest, energizing register 138 through AND gate 146 when the product function is larger, and energizing the register 154 through the AND gate 150 when the constant $2\Delta_0$ is larger. Energization of the register 138 causes the decision unit 45 to furnish the product function stored therein to the increment register 59, with the final polarity of such product function being determined by the polarity control terminals of the registers 114 and 120.

Energization of the constant storage register 154 causes the decision unit 45 to furnish the constant $2\Delta_0$ to the increment register 59, with the polarity or sign of such register controlled by the OR gate 156 controlling the polarity terminal of the register 154.

Table III, set forth below, sets forth the increment signal $\Delta(k+1)$ formed in the decision unit 45 for each of the control signals Y(1) through Y(9), as well as the particular control gate or register causing such increment signal to be transferred to the register 59.

TABLE III

| Y | INCREMENT SIGNAL $\Delta(k+1)$ | CONTROL GATE OR REGISTER |
|---|---|---|
| Y(1) | 0 | 100 (reset at 49a) |
| Y(2) | 0 | 100 (reset at 49a) |
| Y(3) | 0 | 100 (reset at 49a) |
| Y(4) | $-2\Delta_0$ | 106 (input on 108) |
| Y(5) | (a) $-(\alpha + \beta) \cdot |\Delta(k)|$ | (a) 138 |
|  | (b) $-2\Delta_0$ | (b) 154 |
| Y(6) | (a) $-(\alpha - \beta) \cdot |\Delta(k)|$ | (a) 138 |
|  | (b) $-2\Delta_0$ | (b) 154 |
| Y(7) | $+2\Delta_0$ | 106 (input on 94) |
| Y(8) | (a) $(\alpha - \beta) \cdot |\Delta(k)|$ | (a) 138 |
|  | (b) $2\Delta_0$ | (b) 154 |
| Y(9) | (a) $(\alpha + \beta) \cdot |\Delta(k)|$ | (a) 138 |
|  | (b) $2\Delta_0$ | (b) 154 |

VALUES OF INPUT CONSTANTS

In the preferred embodiment, the values of the constants $\alpha$ and $\beta$ are digital numbers corresponding to analog values of 1 and $\frac{1}{2}$, respectively. Those values have gained wide acceptance in delta modulation systems. For these values of $\alpha$ and $\beta$, the ratios between $\Delta(k+1)$ and $\Delta(k)$ only take the analog values $\pm 1\frac{1}{2}$ and $\pm \frac{1}{2}$. Further, since dividing by two with binary numbers may be performed by shifting the number to the right one bit and truncating the result in a conventional register, multiplication by one and one-half is easily obtained by adding $\Delta(k)$ to its shifted version. Hence, the multiplications are reduced to a simple "shift" operation for estimates of one-half or to a "shift plus one" for estimates of one and one-half operation, with the proper sign bit taken into consideration.

As an example value for the threshold level $\epsilon_\nu$, the threshold signal Z provided at the threshold input terminal 24 from an external source (FIG. 3) may have a value substantially equal to the tolerance variations of the comparators to thereby reduce the occurrence of erroneous indications of differences between the present sample and the estimate thereof.

The value assigned to $2\Delta_0$ is determined based on the minimum desirable increment to be formed at a time of transition from a level (tracking mode) status to an increasing or decreasing (acquisition mode) status and is based on expected magnitudes of transitions or changes in magnitude of the particular analog signal being encoded. A suitable value, for example, for $2\Delta_0$ is a digital number corresponding to the analog value 2, when a six-bit precision (64 quantization levels) is used.

ENCODING AND DECODING

As previously described, the digital status change code B(k) is modulated onto a carrier for transmission over a communications path to a receiver for demodulation into a signal B'(k) corresponding to the status change code B(k) formed in the encoding apparatus A. The signal B'(k) is then decoded to form the reconstructed analog sample R(k) which after filtering represents the reconstructed analog version R(t) of the input analog signal S(t). An estimator E of the encoding apparatus A or A-1 serves as a decoding apparatus according to the present invention to form the signal R(k). Such a decoding apparatus receives the signal B'(k) as an input to the decision unit 45 (FIG. 3) and the register 46 and forms therefrom a reconstructed signal R(k) provided as an output over the conductor 18, in a like manner to the operation of the estimator E, as set forth above. FIG. 3A details a complete communication system that includes such encoding and decoding units. Timing information provided in the transmitter by a common clock (not shown) is recovered in the channel Demodulator for the Receiver.

Again, as already mentioned, one main advantage of the present invention is due to the immediate adaptability of its output to data compaction encoding schemes. Any Run-Length encoder, e.g., introduced between the B(k) output and the modulator of the communication channel will significantly reduce the signaling rate of the information that needs to be accommodated by the channel.

All that such additional encoding schemes will require are three counting devices that shall count the number of similar and consecutive B(k) words included in each data string. Each such string (no matter how long it is) will then, using a limited amount of additional logic circuits, be replaced, before modulation and transmission, by a two symbol word only. The first such symbol will then indicate the type of status change signal under consideration and the second symbol—its length.

Those two-symbol words can then be designed in a way that takes advantage of the particular characteristics of the statistical Run-Length distributions in the pictorial data involved, using available design techniques (based on information theory results).

Extensive simulations using quite a wide selection of digitized pictures have been performed in developing the invention. They verify the data compaction aspects of the device. The results obtained proved to be very satisfactory both with respect to the compression ratios and the equipment complexity needed to obtain them.

OVERSHOOT SUPPRESSION

A very disturbing problem in the transmission of video signals through conventional (adaptive) delta modulation systems is the occurrence of large overshoots in the estimator output, when it tracks large and fast transitions between voltage levels. Those overshoots (O.S.) produce a multiple edge distortion in the reproduced pictures.

Overshoot suppressions (O.S.S.) algorithms and circuits implementing them have been described in the technical literature. All seem to display a limited effectiveness in resolving this disturbance.

An improved such O.S.S. algorithm has been developed for and incorporated into the present invention with extremely satisfactory results and modest additional equipment complexity. This algorithm is briefly outlined (for the two bit per word, serial, format of B(k) below. Its effectiveness results mainly from the fact that the compressed overshoot can now "catch-on" into one of three rather than one of two states during its recovery time. This increases the number of degrees of freedom of the suppression algorithm and hence its improved performance.

To implement the algorithm, a buffer register for storing in memory the five consecutive B(k) words: B(k-5) to B(k) is required. Its suppression mechanism (the cutting of the $\Delta(k+1)$ increment in half) is activated whenever one of two characteristic patterns in the string of B(k) words (memorized as above) is detected. These patterns are:
01; 01; 01; 11; 11; 01 for an overshoot; and
11; 11; 11; 01; 01; 11 for an undershoot.

When one of these two patterns is detected, the O.S.S. mechanism in the Estimator replaces:
X(k) by X(k+1); X(k-2) by X(k-1) and B(k) by 00.

X(k+1) being calculated continuously from already available signals in the original device (without O.S.S. included) from $X(k+1)=X(k)+\Delta(k+1)$.

When no such characteristic pattern is detected, the device will perform in an ordinary way as previously indicated.

The returning to a normal operating condition after a correction cycle has been performed will start by the updating of all variables as follows:
Replace
X(k-2) by X(k-1)
X(k-1) by X(k)
X(k) by X(k+1)
B(k-5) by B(k-9)
B(k-1) by B(k)

The results obtained by a computer simulation at the output of the device for a step-function applied at its input are illustrated with and without O.S.S. in FIGS. 7 and 8 respectively.

OPERATION

In the operation of the encoding apparatus A (FIGS. 1 and 3), the subtractor J subtracts the estimate X(k) formed in the estimator E from the sample S(k) of the analog signal S(t) during a sample interval k to form a difference signal D(k) which may have a positive, zero, or negative value. The comparison logic unit 22 compares the difference signal D(k) to the threshold signal Z to form the digital status change code B(k) to indicate increasing, unchanged, and decreasing status conditions or states, respectively. Such a three bit parallel binary word may be further encoded according to a suitable run-length encoding scheme prior to transmission over a communication path to the receiver, which contains a decoding apparatus which is a duplicate of the estimator E. The decoding apparatus used the received status code B'(k) to generate a reconstructed value of the sample S(k).

It should be noted that simplicity in structure of the comparison logic unit 22 (FIG. 4) is obtained with the present invention since the difference signal is compared to the threshold signal Z. The advantages of using such a threshold signal Z are optimized when the value of the threshold signal takes into consideration the voltage tolerances in the operating parameters of the comparators 36 and 38 to prevent erroneous indications of differences between the sample S(k) and the estimate X(k) thereof, and thereby reduce granularity in the reconstructed analog signal.

Furthermore, the threshold signal Z serves a second advantageous function when only the essential information in an analog signal needs to be preserved and reconstructed. For example, the threshold signal Z may be set at a value sufficiently large to cause the comparison logic unit 22 to generate a status change code B(k) indicating an unchanged status condition l(k) whenever the present sample and the estimate thereof have substantially equal magnitudes. The signal Z, as a result, may be used to smooth and reduce the noise content of the analog signal estimate R(k) reconstructed from the digital status change signal B(k) at the decoder. Use of the threshold signal Z in the encoder A thus serves as a powerful tool for smoothing and removing excessive noise or, if necessary, reducing information content in picture transmission systems. Other important applications of the threshold signal Z rely on the possibility to externally control it in adaptive schemes. One such illustrative application in the pattern recognition field is the possibility to use a variable Z for changing the number and size of connected features that can be extracted from a given picture.

It should also be noted that the encoding apparatus A of the present invention, in forming a status change code B(k) in the manner set forth above operates in a like manner to a conventional delta modulator in the acquisition mode, i.e., the periods when the sample signal has a rising or falling value.

During the tracking mode when signal levels are substantially unchanged, the encoding apparatus A transmits a digital status change signal consisting of a series of sample interval codes indicating only the unchanged status condition.

The decoder during the tracking mode thus accurately reconstructs a signal R(k) having a substantially constant magnitude without being required to decode minor signal level fluctuations as the beginning of an abrupt increase or decrease in signal level.

Thus, by including a third state in delta modulation according to the present invention, modulation and demodulation performance is improved by separating the encoding functions performed during the acquisition (rising or falling) and the tracking (level) modes of operation. This improved performance has the important result of cancelling the disturbing granularity effects previously inherent in the reconstructed video signals of conventional delta modulation signals. It also enables more efficient O.S. schemes to be incorporated in picture transmission systems.

Thus, the addition of the third status condition permits improved tracking mode performance without adversely affecting the improved acquisition mode performance resulting from other techniques.

Figure 6:
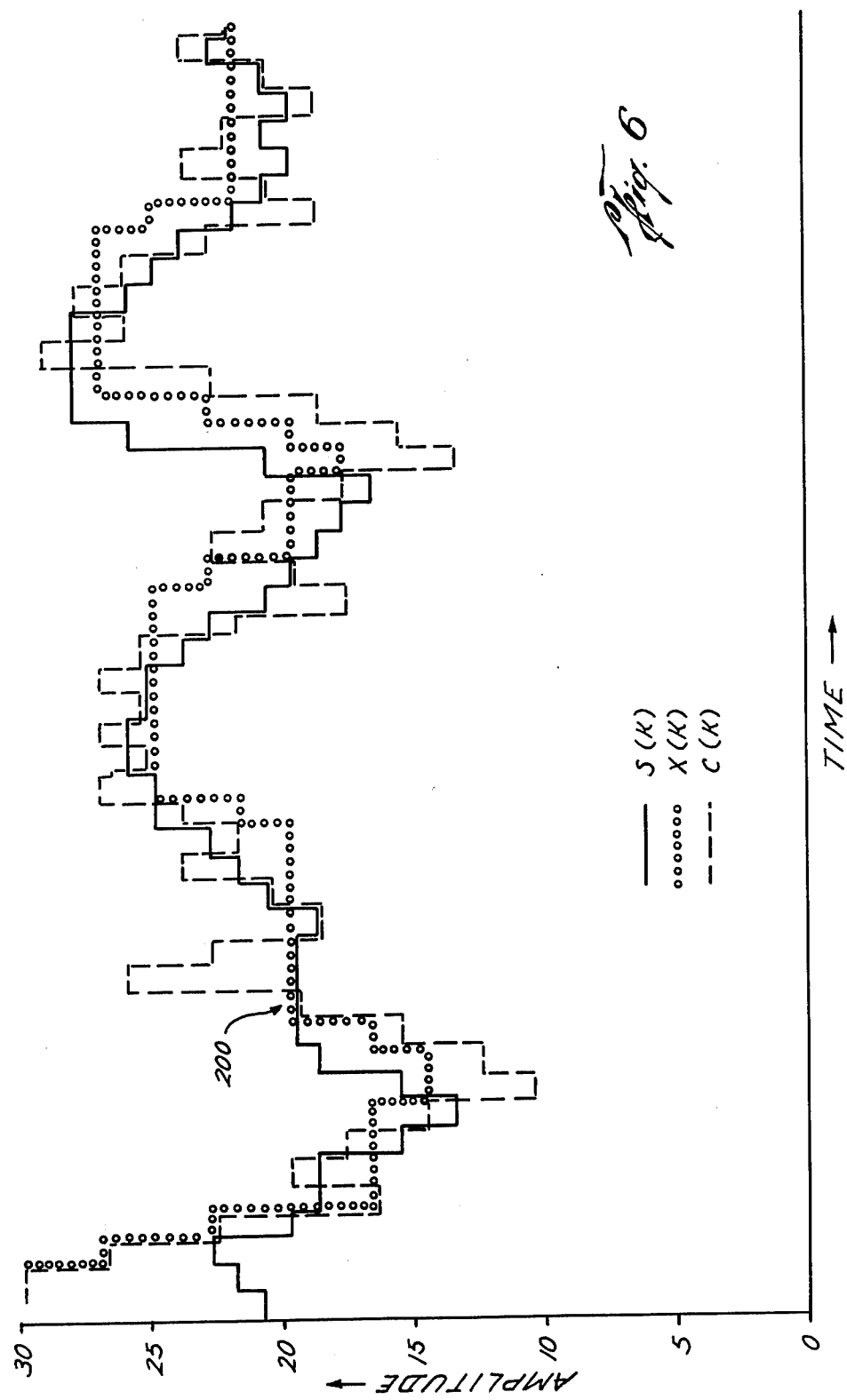
FIG. 6 is a waveform diagram of sample estimates formed by a conventional delta modulator and the encoding apparatus of the present invention, as obtained by computer simulations.

The improved performance of the tri-state delta modulation system over the conventional adaptive delta modulation is illustrated by the waveform diagram (FIG. 6) which shows sample estimates X(k) of a tri-state delta modulation system according to the present invention with $Z=\pm 2$ and sample estimates C(k) of a conventional adaptive delta modulation system for the same analog input signal samples S(k). Attention is directed to the marked difference in tracking accuracy between the waveform X(k) as contrasted to the waveform C(k), particularly where, as at 200, the waveform samples S(t) are substantially unchanged.

It should be noted that estimators implementing other adaptive delta modulation and overshoot suppression techniques, may be used for generating the estimate X(k) for use with the subtractor J and the state extractor C of the present invention in three state delta modulation according to the techniques of the present invention set forth above.

Although the present invention has been described in the foregoing disclosure in an analog circuit component implementation, it should be understood that the three-state modulation technique may equally as well be implemented with digital circuitry and logic.

In the digital embodiment, as will be understood by those in the art, conductors in the analog circuit are replaced by data busses having one wire per data bits of each word, and analog circuit components are replaced by their digital equivalents.

The foregoing disclosure and description of the invention are illustrative and explanatory thereof, and various changes in the size, shape, materials, components, circuit elements, wiring connections and contacts, as well as in the details of the illustrated circuitry and construction may be made without departing from the spirit of the invention.

I claim:

1. An apparatus for encoding an analog signal into a digital status change signal in the form of a binary coded pulse train which indicates the difference between a present sample of the analog signal and an estimate of the present sample as being increasing, decreasing or unchanged, comprising:
(a) difference signal means for generating from the present sample in a succession of uniformly spaced samples and the estimate thereof a difference signal representing the difference between the present sample and the estimate;
(b) signal generating means for generating from the difference signal a digital status change code forming the digital status change signal which indicates an increasing, decreasing, or unchanged status of the present sample with respect to the estimate thereof, said signal generating means comprising
  (i) means for defining a threshold signal level which may be adaptively changed for different applications;
  (ii) means for comparing the difference signal to the defined threshold signal level, said comparison means indicating whether the present sample is less than, greater than, or substantially unchanged from the estimate thereof, and
  (iii) output signal means for forming the digital status change signal to indicate an increasing, decreasing, or unchanged status in response to the present sample being less than, greater than, or substantially equal to the estimate, respectively, said output signal means comprising:
    increasing status output generator means for forming a binary signal indicating whether or not the present sample is less than the estimate thereof by an amount greater than the defined threshold signal;
    decreasing status output generator means for forming a binary signal indicating whether or not the present sample is greater than the estimate thereof by an amount greater than the defined threshold; and
    unchanged status output generator means for forming a binary signal indicating whether or not the present sample differs from the estimate thereof by an amount less than the defined threshold.

2. An apparatus for encoding an analog signal into a digital status change signal in the form of a binary coded pulse train which indicates the difference between a present sample of the analog signal and an estimate of the present sample as being increasing, decreasing or unchanged, comprising:
(a) difference signal means for generating from the present sample in a succession of equally spaced samples and the estimate thereof a difference signal representing the difference between the present sample and the estimate,
(b) signal generating means for generating from the difference signal, a digital status change code forming the digital status change signal which indicates an increasing, decreasing, or unchanged status of the present sample with respect to the estimate thereof, said signal generating means comprising:

means for defining a threshold signal level which may be adaptively changed for different applications;

means for comparing the difference signal to the defined threshold signal level and including output signal means for forming the digital status change signal to indicate an increasing, decreasing, or unchanged status in response to the present sample being less than, greater than, or substantially equal to the estimate, respectively, said output signal means comprising status output generator means for forming a signal which indicates whether the present sample is different from the estimate by an amount less than said threshold signal level, whether the present sample is less than the estimate by an amount greater than said threshold signal level, and whether the present sample is greater than the estimate by an amount greater than said threshold signal level.

3. The apparatus of claim 2, further including:

run-length encoder means for run-length encoding said digital status change code from said signal generating means.

4. The apparatus of claim 2, wherein the apparatus forms digital status change signals for plural successive uniform samples of the analog signal during successive sample intervals and comprises:

estimate generating means connected between the output signal means and the difference signal means for generating the present estimate from the estimate and the status change signal of a prior sample interval.

5. The apparatus of claim 4, wherein:

said estimate generating means generates the present estimate by adding an increment signal to the estimate of the first previous sample interval if the status change code of the first previous sample interval indicates an increasing status, substracting an increment from the first previous sample interval estimate if the status change code thereof indicates a decreasing status, and providing a present estimate equal to the first previous sample interval estimate if the status change code thereof indicates an unchanged status.

6. The apparatus of claim 4, wherein:

said estimate generating means adaptively generates the present estimate from a plurality of estimates and status change signals of prior sample intervals.

7. The apparatus of claim 6, wherein:

said estimate generating means adaptively generates the present estimate from an estimate of a first previous sample interval, the differential increment between the first previous sample interval estimate and a second previous sample interval estimate, and first and second previous sample interval status change signals.

8. A method of encoding an analog signal into a binary coded digital status change signal which indicates the difference between a present sample of the analog signal and an estimate of the present sample as being increasing, decreasing, or unchanged, comprising the steps of:

(a) generating from the present sample in a succession of uniformly spaced samples and the estimate thereof a difference signal representing the difference between the present sample and the estimate;

(b) generating from the difference signal, a digital status change code forming the digital status change signal which indicates an increasing, decreasing, or unchanged status of the present sample with respect to the estimate thereof in response to the present sample being less than, greater than, or substantially equal to the estimate, respectively, said step of generating a digital status change code further comprising the steps of:

(1) defining a threshold signal level, which may be adaptively changed for different purposes and applications, to be substantially equal to the tolerance variations occurring in the step of generating a digital status change signal thereby reducing the occurrence of erroneous indications of differences between the present sample and the estimate thereof;

(2) comparing the difference signal to the defined threshold signal level for indicating whether the present sample is less than, greater than, or substantially unchanged from the estimate thereof;

(3) using the defined threshold level for reducing noise or information content in the signal.

9. A method of encoding an analog signal into a binary coded digital status change signal which indicates the difference between a present sample of the analog signal and an estimate of the present sample as being increasing, decreasing, or unchanged, comprising the steps of:

(a) generating from the present sample and the estimate thereof in a succession of uniformly spaced sample intervals, a difference signal representing the difference between the present sample and the estimate;

(b) generating, from the difference signal, a digital status change code forming the digital status change signal which indicates an increasing, decreasing, or unchanged status of the present sample with respect to the estimate thereof in response to the present sample being less than, greater than, or substantially equal to the estimate, respectively, said step of generating a digital status change code further comprising the steps of:

defining a threshold signal level which may be adaptively changed for different purposes and applications;

comparing the difference signal to the defined threshold signal level;

forming a binary signal indicating whether or not the present sample is less than the estimate thereof by an amount greater than the defined threshold; and forming a binary signal indicating whether or not the present sample differs from the estimate thereof by an amount less than the defined threshold.

10. The method of claim 9, wherein:

said steps for forming increasing, decreasing and unchanged status binary signals occur simultaneously to form a three bit parallel binary word status signal.

11. The method of claim 10, wherein the step of forming the digital status change code further comprises the step of:

converting the three bit parallel binary word to a two bit serial binary word.

12. A method of encoding an analog signal into a binary coded digital status change signal which indicates the difference between a present sample of the analog signal and an estimate of the present sample as being increasing, decreasing, or unchanged, comprising the steps of:
(a) generating from the present sample and the estimate thereof a difference signal representing the difference between the present sample and the estimate;
(b) generating, from the difference signal, a digital status change code forming the digital status change signal which indicates an increasing, decreasing, or unchanged status of the present sample with respect to the estimate thereof;
(c) detecting undershoot or overshoot characteristic patterns in successive digital change signals; and
(d) adjusting the estimate of the present sample used in said step of generating a difference signal in response to detection of said characteristic patterns.

* * * * *